United States Patent
Macko

(10) Patent No.: US 11,104,280 B2
(45) Date of Patent: Aug. 31, 2021

(54) VEHICULAR ELECTRONIC ACCESSORY MODULE WITH ENHANCED GROUNDING CONTACT

(71) Applicant: Magna Electronics Inc., Auburn Hills, MI (US)

(72) Inventor: Andrew R. Macko, Clarkston, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

(21) Appl. No.: 16/949,126

(22) Filed: Oct. 15, 2020

(65) Prior Publication Data

US 2021/0107413 A1    Apr. 15, 2021

Related U.S. Application Data

(60) Provisional application No. 62/915,124, filed on Oct. 15, 2019.

(51) Int. Cl.
  *B60R 11/04* (2006.01)
  *H05K 1/02* (2006.01)
  *H05K 9/00* (2006.01)
  *H04N 5/225* (2006.01)

(52) U.S. Cl.
  CPC ........... *B60R 11/04* (2013.01); *H04N 5/2257* (2013.01); *H05K 1/0215* (2013.01); *H05K 1/0218* (2013.01); *H05K 9/0039* (2013.01)

(58) Field of Classification Search
  None
  See application file for complete search history.

(56) References Cited

U.S. PATENT DOCUMENTS

| | | |
|---|---|---|
| 5,550,677 A | 8/1996 | Schofield et al. |
| 5,563,450 A * | 10/1996 | Bader ................ H01R 13/6485 257/785 |
| 5,670,935 A | 9/1997 | Schofield et al. |
| 5,949,331 A | 9/1999 | Schofield et al. |
| 7,965,336 B2 | 6/2011 | Bingle et al. |
| 8,542,451 B2 | 9/2013 | Lu et al. |
| 8,994,878 B2 | 3/2015 | Byrne et al. |
| 9,077,098 B2 | 7/2015 | Latunski |
| 9,233,641 B2 | 1/2016 | Sesti et al. |
| 9,277,104 B2 | 3/2016 | Sesti et al. |
| 9,621,769 B2 | 4/2017 | Mai et al. |
| 10,142,532 B2 | 11/2018 | Mleczko |
| 10,230,875 B2 | 3/2019 | Mleczko et al. |
| 10,250,004 B2 | 4/2019 | Conger et al. |
| 10,272,857 B2 | 4/2019 | Conger et al. |
| 2009/0244361 A1 | 10/2009 | Gebauer et al. |

(Continued)

*Primary Examiner* — Rebecca A Volentine
(74) *Attorney, Agent, or Firm* — Honigman LLP

(57) ABSTRACT

A vehicular accessory module includes a circuit board and a metal enclosure. An electrically conductive grounding contact affixed at a first side of the circuit board and electrically connected to circuitry at the circuit board. The grounding contact is disposed between and contacts both the first side of the circuit board and the metal enclosure to provide an electrical connection between the circuit board and the metal enclosure. The grounding contact includes an abrasive surface that is in contact with the metal enclosure. Movement of the grounding contact relative to the metal enclosure causes the abrasive surface to scrape the metal enclosure to enhance grounding of the grounding contact with the metal enclosure.

17 Claims, 4 Drawing Sheets

(56) References Cited

U.S. PATENT DOCUMENTS

| | | | |
|---|---|---|---|
| 2013/0129335 A1* | 5/2013 | Gainer | G03B 17/14 |
| | | | 396/144 |
| 2013/0242099 A1 | 9/2013 | Sauer et al. | |
| 2014/0373345 A1 | 12/2014 | Steigerwald | |
| 2015/0124098 A1 | 5/2015 | Winden et al. | |
| 2015/0222795 A1 | 8/2015 | Sauer et al. | |
| 2015/0266430 A1 | 9/2015 | Mleczko et al. | |
| 2015/0327398 A1 | 11/2015 | Achenbach et al. | |
| 2015/0365569 A1 | 12/2015 | Mai et al. | |
| 2016/0037028 A1 | 2/2016 | Biemer | |
| 2016/0243987 A1 | 8/2016 | Kendall | |
| 2016/0268716 A1 | 9/2016 | Conger et al. | |
| 2016/0286103 A1 | 9/2016 | Van Dan Elzen | |
| 2017/0129419 A1 | 5/2017 | Conger et al. | |
| 2017/0133811 A1 | 5/2017 | Conger et al. | |
| 2017/0201661 A1* | 7/2017 | Conger | H04N 5/2252 |
| 2017/0280034 A1 | 9/2017 | Hess et al. | |
| 2017/0295306 A1 | 10/2017 | Mleczko | |
| 2017/0302829 A1 | 10/2017 | Mleczko et al. | |
| 2018/0072239 A1 | 3/2018 | Wienecke et al. | |
| 2018/0098033 A1 | 4/2018 | Mleczko et al. | |
| 2019/0121051 A1 | 4/2019 | Byrne et al. | |
| 2019/0124238 A1 | 4/2019 | Byrne et al. | |
| 2019/0124243 A1 | 4/2019 | Mleczko et al. | |
| 2019/0306966 A1 | 10/2019 | Byrne et al. | |
| 2020/0001787 A1 | 1/2020 | Lu et al. | |
| 2020/0022290 A1* | 1/2020 | Lin | H05K 7/1427 |
| 2020/0033549 A1 | 1/2020 | Liu et al. | |
| 2020/0137926 A1 | 4/2020 | Wohlte | |
| 2020/0154020 A1 | 5/2020 | Byrne et al. | |
| 2020/0412925 A1 | 12/2020 | Byrne et al. | |

* cited by examiner

VEHICULAR ELECTRONIC ACCESSORY MODULE WITH ENHANCED GROUNDING CONTACT

CROSS REFERENCE TO RELATED APPLICATION

The present application claims priority of U.S. provisional application Ser. No. 62/915,124, filed Oct. 15, 2019, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties.

SUMMARY OF THE INVENTION

The present invention provides a driver assistance system or vision system or imaging system for a vehicle that utilizes one or more cameras (preferably one or more CMOS cameras) to capture image data representative of images exterior of the vehicle, and a circuit board and metal enclosure. The grounding contact is affixed at the circuit board and disposed between and contacts the circuit board and the metal enclosure to provide an electrical connection between the circuit board and the metal enclosure. The grounding contact includes an abrasive surface that is in contact with the metal enclosure. The accessory module may comprise a camera module having a camera that is operable to capture image data for a vehicular vision system or driving assist system of the vehicle.

These and other objects, advantages, purposes and features of the present invention will become apparent upon review of the following specification in conjunction with the drawings.

DESCRIPTION OF THE PREFERRED EMBODIMENTS

A vehicular vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
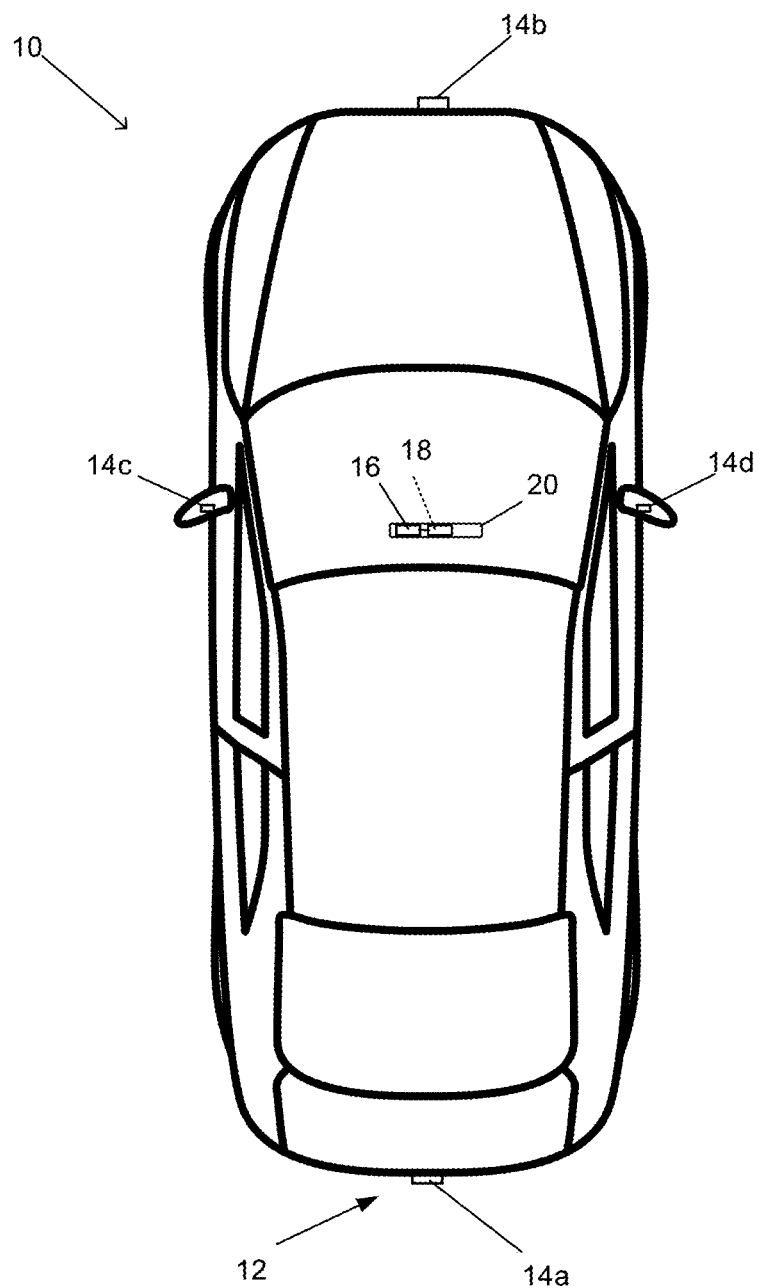
FIG. 1 is a plan view of a vehicle with a vision system that incorporates cameras in accordance with the present invention.

Referring now to the drawings and the illustrative embodiments depicted therein, a vehicle 10 includes an imaging system or vision system 12 that includes at least one exterior viewing imaging sensor or camera, such as a rearward viewing imaging sensor or camera 14a (and the system may optionally include multiple exterior viewing imaging sensors or cameras, such as a forward viewing camera 14b at the front (or at the windshield) of the vehicle, and a sideward/rearward viewing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) 18 having electronic circuitry and associated software, with the electronic circuitry including a data processor or image processor that is operable to process image data captured by the camera or cameras, whereby the ECU may detect or determine presence of objects or the like and/or the system provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

Figure 2A:
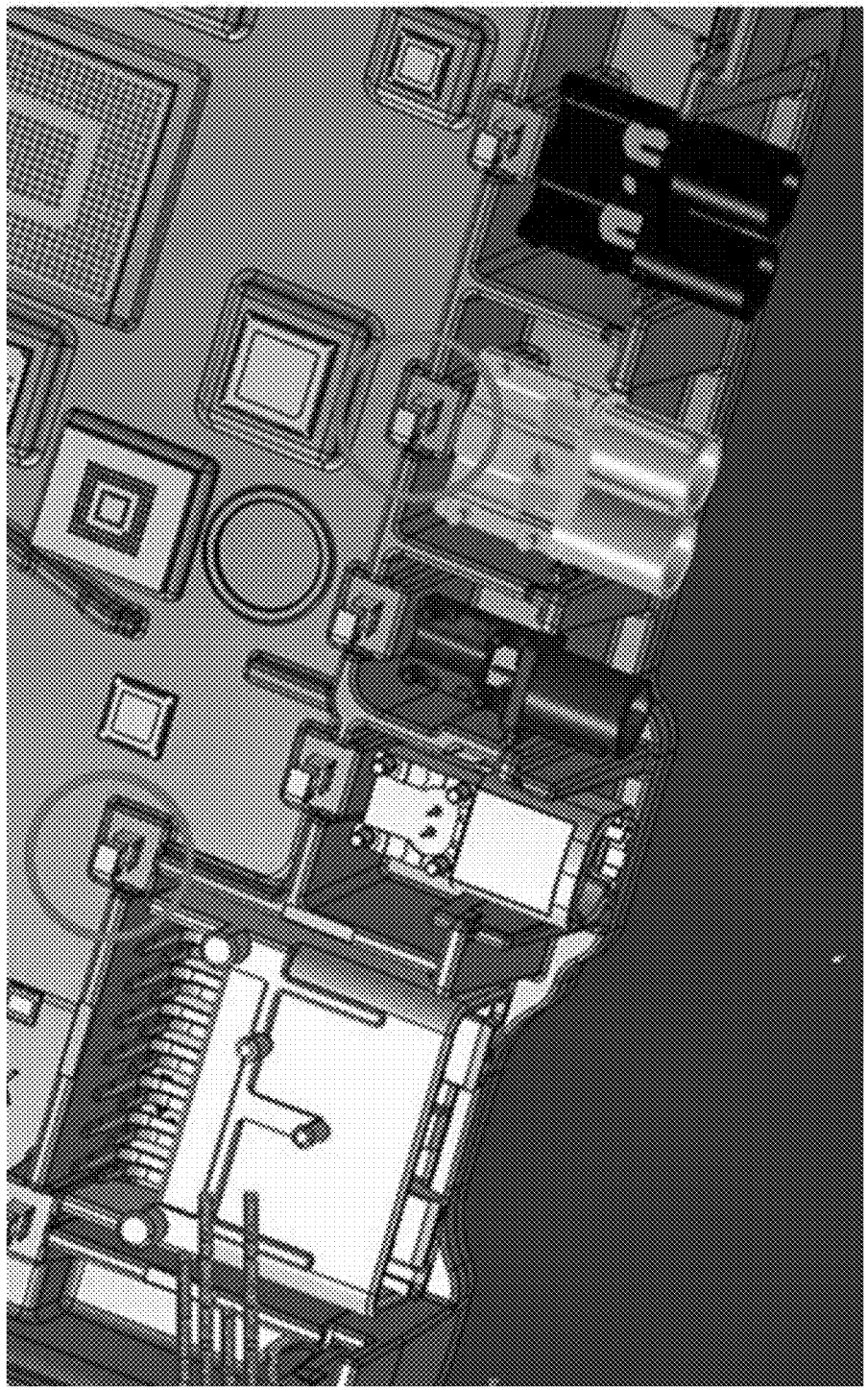
FIGS. 2A and 2B are perspective views of a circuit board including spring fingers.
Figure 2B:
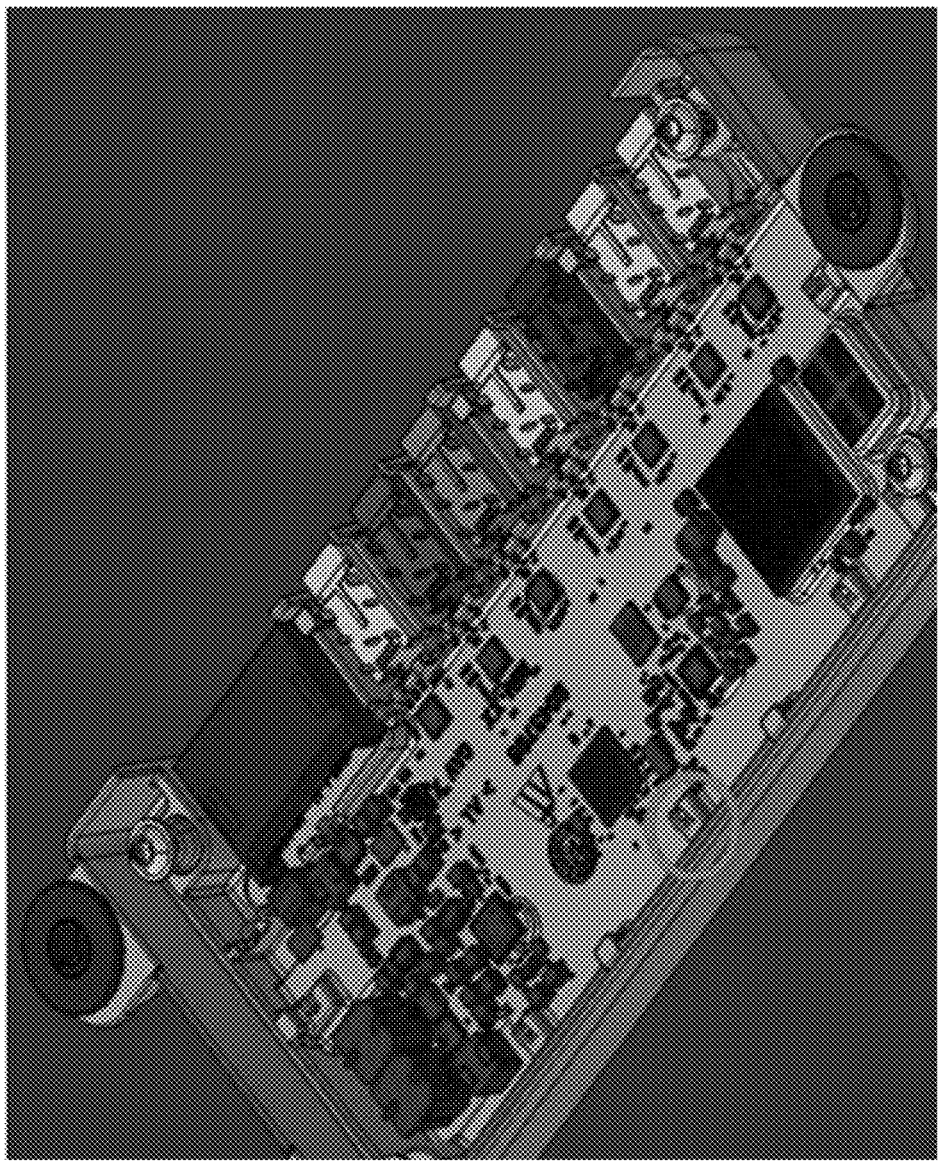

Various aspects of the vision system (e.g., the control or processor, the camera(s), etc.) may be contained within an electronic module. The electronic module (such as a camera) may include a printed circuit board (PCB) disposed within a metal enclosure. Referring now to FIGS. 2A and 2B, it is common to use metal spring fingers to provide an electrical contact between the PCB and the metal enclosure. The electrical contact contains electrical noises within the electronic module and modules to comply with any Electromagnetic Compatibility (EMC) requirements. Pads of the spring fingers are soldered to the PCB and the spring fingers then make a compressive contact with the metal housing, thus electrically connecting the pad to the metal housing. The spring fingers may be used is to ensure an electrical contact through the lifetime of the module. However, the use of metal spring fingers may be relatively expensive and contribute to the overall cost of the module.

Figure 3:
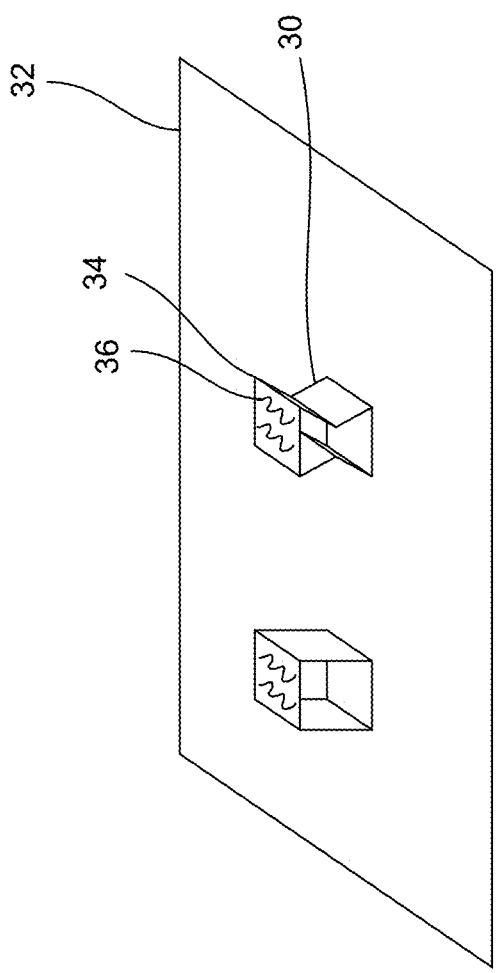
FIG. 3 is a perspective view of a circuit board with grounding contacts in accordance with the present invention.

Implementations of the present invention provide a potentially cheaper alternative to spring fingers. Referring now to FIG. 3, one or more grounding contacts 30 are disposed on a circuit board 32. The grounding contacts may, for example, be a foam-cored contact with a metalized polyimide film outer covering. The top of each grounding contact may include a pad 34 with a flat surface where it contacts the metal housing. Each grounding contact also includes an abrasive or roughened surface 36 or knurled surface or toothed surface to enhance engagement with and electrical connection with the metal housing or enclosure.

Many metal enclosures are cast aluminum, which quickly oxidizes to produce Aluminum Oxide ($Al_2O_3$), which is an electrical insulator. Because the grounding contacts or the structure in the camera that supports the circuit board may have different Coefficients of Thermal Expansion (CTE) than the aluminum enclosure, the metal enclosure and grounding contact will move relative to one another. With the roughened or abrasive contact surface of the grounding contact, such movement provides a wiping or scraping motion to rub or grind or scrape or otherwise remove the very thin layer of aluminum oxide that forms on the enclosure which helps allow the grounding contact 30 via the pad 34 to maintain good electrical contact with the metal enclosure. That is, the pad 34 that contacts the metal housing may be abrasive so that during thermal expansion, movement of the pad 34 relative to the housing or enclosure will remove buildup of aluminum oxide. The pad 34 may be formed with the abrasive or roughened or undulated surface (such as having sharp ridges or bumps or protrusions). For example, the pad may be corrugated. The pad may also be roughened using tools during or after manufacturing (e.g., drilling, grinding, sanding, etc.).

Therefore, the vision system provides for enhanced electrically conductive connection between circuitry at the printed circuit board and the metal enclosure or housing. The grounding contact has one side or surface affixed (such as via soldering or via a fastener or the like) to the circuit board (and in electrical connection with a ground circuit or conductive trace at the circuit board) and another side or surface (such as the opposite or distal side or surface distal from the attaching surface at the circuit board) that is roughened and that engages an inner surface of the metal housing or enclosure. The roughened surface provides enhanced electrical connection of the grounding contact with the metal enclosure and functions to remove buildup of aluminum oxide as the grounding contact may move relative to the enclosure during temperature fluctuations (due to different CTEs of the grounding contact material and the enclosure material).

Examples herein illustrate the grounding contact used in an accessory module having a printed circuit board (PCB) for a camera of an imaging system. The camera may comprise an exterior camera disposed at an exterior portion of the vehicle so as to view exterior of the vehicle, or the camera may comprise an interior mounted camera, such as a windshield-mounted camera that views forward through the windshield of the vehicle, or such as an interior cabin monitoring camera that is disposed in the cabin of the vehicle so as to view the driver and/or passenger(s) of the vehicle. The grounding contact may be disposed at an imager PCB of the camera module with the circuitry on the imager PCB including an imager, or the grounding contact may be disposed at a processor PCB of the camera module with the circuitry on the processor PCB including an image processor operable to process image data captured by the imager.

However, uses of the grounding contact are not limited to vision systems and may be used on any printed circuit board in any application. For example, the grounding contact may be incorporated at any type of vehicular accessory module, such as any other type of sensor of the vehicle (e.g., at a radar sensor or lidar sensor or microphone or the like), or at an ECU that is separate from the cameras or sensors. Optionally, the grounding contact may be used in any accessory module with a suitable metal enclosure and/or exposed to temperatures significant enough to generate scraping movements based on differences in CTEs of the housing and the grounding contact materials (e.g., exterior security cameras).

The camera may utilize materials that assist in accommodating changes in the camera when the camera is exposed to extreme temperatures, such as below −20 degrees C. or below −40 degrees C. and/or above 60 degrees C. or above 80 degrees C., and may utilize aspects of the cameras described in U.S. Publication Nos. U.S. Publication Nos. US-2020-0033549; US-2020-0154020; US-2020-0137926; US-2020-0001787; US-2019-0306966; US-2019-0121051; US-2019-0124243 and/or US-2019-0124238, and/or U.S. patent application Ser. No. 16/946,516, filed Jun. 25, 2020, which are all hereby incorporated herein by reference in their entireties.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271;

US-2013-0141578 and/or US-2013-0002873, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/081985, and/or U.S. Pat. No. 9,126,525, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular accessory module comprising:
   a circuit board having a first side and a second side separated by a thickness of the circuit board, the circuit board having circuitry disposed thereat;
   a metal enclosure that houses the circuit board;
   an electrically conductive grounding contact affixed at the first side of the circuit board and electrically connected to circuitry at the circuit board;
   wherein the grounding contact is disposed between and contacts both the first side of the circuit board and the metal enclosure to provide an electrical connection between the circuit board and the metal enclosure;
   wherein the grounding contact comprises an abrasive surface;
   wherein the abrasive surface is in contact with the metal enclosure;
   wherein movement of the grounding contact relative to the metal enclosure causes the abrasive surface to scrape the metal enclosure to enhance grounding of the grounding contact with the metal enclosure; and
   wherein the coefficient of thermal expansion of the grounding contact is different than the coefficient of thermal expansion of the metal enclosure, and wherein movement of the grounding contact relative to the metal enclosure is at least in part due to the different coefficients of thermal expansion.

2. The vehicular accessory module of claim 1, wherein the abrasive surface is corrugated.

3. The vehicular accessory module of claim 1, wherein the metal enclosure comprises a cast aluminum metal enclosure.

4. The vehicular accessory module of claim 1, wherein the vehicular accessory module comprises a camera configured to be disposed at a vehicle, the camera, when disposed at the vehicle, capturing image data.

5. The vehicular accessory module of claim 4, wherein the circuitry comprises an image processor for processing image data captured by the camera.

6. The vehicular accessory module of claim 1, wherein the grounding contact is soldered at the first side of the circuit board.

7. The vehicular accessory module of claim 1, wherein the grounding contact comprises a foam-cored contact.

8. The vehicular accessory module of claim 7, wherein the grounding contact comprises a metalized polyimide film outer covering.

9. The vehicular accessory module of claim 1, wherein the grounding contact comprises a pad, and wherein the pad comprises the abrasive surface.

10. A vehicular accessory module comprising:
    a circuit board having a first side and a second side separated by a thickness of the circuit board, the circuit board having circuitry disposed thereat;
    a metal enclosure that houses the circuit board;
    an electrically conductive grounding contact soldered at the first side of the circuit board and electrically connected to circuitry at the circuit board;
    wherein the grounding contact is disposed between and contacts both the first side of the circuit board and the metal enclosure to provide an electrical connection between the circuit board and the metal enclosure;
    wherein the grounding contact comprises a pad at an end of the grounding contact that is distal from an end of the grounding contact that is soldered at the first side of the circuit board, and wherein the pad comprises an abrasive surface;
    wherein the abrasive surface is in contact with the metal enclosure;
    wherein movement of the grounding contact relative to the metal enclosure causes the abrasive surface to scrape the metal enclosure to enhance grounding of the grounding contact with the metal enclosure; and
    wherein the coefficient of thermal expansion of the grounding contact is different than the coefficient of thermal expansion of the metal enclosure, and wherein movement of the grounding contact relative to the metal enclosure is at least in part due to the different coefficients of thermal expansion.

11. The vehicular accessory module of claim 10, wherein the metal enclosure comprises a cast aluminum metal enclosure.

12. The vehicular accessory module of claim 10, wherein the grounding contact comprises a foam-cored contact.

13. The vehicular accessory module of claim 10, wherein the vehicular accessory module comprises a camera configured to be disposed at a vehicle, the camera, when disposed at the vehicle, capturing image data.

14. The vehicular accessory module of claim 13, wherein the circuitry comprises an image processor for processing image data captured by the camera.

15. A vehicular accessory module comprising:
    a circuit board having a first side and a second side separated by a thickness of the circuit board, the circuit board having circuitry disposed thereat;
    wherein the vehicular accessory module comprises a camera configured to be disposed at a vehicle, the camera, when disposed at the vehicle, capturing image data;
    wherein the circuitry comprises an image processor for processing image data captured by the camera;
    a cast aluminum metal enclosure that houses the circuit board;
    an electrically conductive grounding contact affixed at the first side of the circuit board and electrically connected to circuitry at the circuit board;
    wherein the grounding contact is disposed between and contacts both the first side of the circuit board and the cast aluminum metal enclosure to provide an electrical connection between the circuit board and the cast aluminum metal enclosure;
    wherein the grounding contact comprises an abrasive surface;
    wherein the abrasive surface is in contact with the cast aluminum metal enclosure;
    wherein movement of the grounding contact relative to the cast aluminum metal enclosure causes the abrasive surface to scrape the cast aluminum metal enclosure to enhance grounding of the grounding contact with the cast aluminum metal enclosure; and wherein the coefficient of thermal expansion of the grounding contact is different than the coefficient of thermal expansion of the cast aluminum metal enclosure, and wherein movement of the grounding contact relative to the cast aluminum metal enclosure is at least in part due to the different coefficients of thermal expansion.

16. The vehicular accessory module of claim 15, wherein the abrasive surface is corrugated.

17. The vehicular accessory module of claim 15, wherein the grounding contact is soldered at the first side of the circuit board.

\* \* \* \* \*